(12) United States Patent
Wei

(10) Patent No.: US 11,314,295 B2
(45) Date of Patent: Apr. 26, 2022

(54) PRESSURIZED INFUSION DEVICE AND LIQUID COOLING SYSTEM

(71) Applicant: COOLER MASTER TECHNOLOGY INC., New Taipei (TW)

(72) Inventor: Yu-Te Wei, New Taipei (TW)

(73) Assignee: COOLER MASTER TECHNOLOGY INC., New Taipei (TW)

(*) Notice: Subject to any disclaimer, the term of this patent is extended or adjusted under 35 U.S.C. 154(b) by 93 days.

(21) Appl. No.: 16/866,986

(22) Filed: May 5, 2020

(65) Prior Publication Data

US 2020/0264679 A1 Aug. 20, 2020

Related U.S. Application Data

(62) Division of application No. 15/332,458, filed on Oct. 24, 2016, now Pat. No. 10,739,829.

(30) Foreign Application Priority Data

Jun. 6, 2016 (TW) .................................. 105208509

(51) Int. Cl.
| | | |
|---|---|---|
| *G06F 1/20* | (2006.01) | |
| *F28D 15/00* | (2006.01) | |
| *F28D 20/00* | (2006.01) | |
| *H01L 23/473* | (2006.01) | |
| *F04B 23/02* | (2006.01) | |
| *H05K 7/20* | (2006.01) | |

(52) U.S. Cl.
CPC .............. *G06F 1/20* (2013.01); *F04B 23/025* (2013.01); *F04B 23/028* (2013.01); *F28D 15/00* (2013.01); *F28D 20/0034* (2013.01); *H01L 23/473* (2013.01); *H05K 7/20272* (2013.01); *H05K 7/20281* (2013.01); *F28F 2250/08* (2013.01); *Y02E 60/14* (2013.01)

(58) Field of Classification Search
CPC ........ G06F 1/20; F04B 23/025; F04B 23/028; F28D 15/00; F28D 20/0034; F28F 2250/08

See application file for complete search history.

(56) References Cited

U.S. PATENT DOCUMENTS 4,640,235 A * 2/1987 Martin ..................... F01P 11/18
123/41.03
6,004,119 A * 12/1999 Hamasaki ............... F04C 11/00
418/181

(Continued)

*Primary Examiner* — Jon T. Schermerhorn, Jr.
(74) *Attorney, Agent, or Firm* — Maschoff Brennan

(57) ABSTRACT

A pressurized infusion device and a liquid cooling system are disclosed. The pressurized infusion device includes a liquid storage tank and a pump. The liquid storage tank has a first end and a second end opposite to the first end. The first end has a first connecting structure, and the second end has a second connecting structure. The pump is connected with the first end of the liquid storage tank and has a third connecting structure, a first connecting port, a second connecting port, a third connecting port and a fourth connecting port. The third connecting structure corresponds to the first connecting structure. A pump flow channel from the first connecting port to the second connecting port is formed inside the pump, and a bypass flow channel from the third connecting port to the fourth connecting port is also formed inside the pump.

2 Claims, 6 Drawing Sheets

(56) References Cited

U.S. PATENT DOCUMENTS

| | | | | |
|---|---|---|---|---|
| 6,234,240 | B1* | 5/2001 | Cheon | F28D 15/00 |
| | | | | 165/185 |
| 7,124,775 | B2* | 10/2006 | Chang | F04D 13/16 |
| | | | | 137/559 |
| 7,371,056 | B2* | 5/2008 | Ito | F04D 13/0673 |
| | | | | 361/695 |
| 7,753,662 | B2* | 7/2010 | Lai | F04D 13/0606 |
| | | | | 417/423.9 |
| 8,631,860 | B2* | 1/2014 | Tang | B65D 51/16 |
| | | | | 165/278 |
| 9,254,948 | B2* | 2/2016 | Tang | G06F 1/20 |
| 10,197,068 | B2* | 2/2019 | Tazioli | F04D 13/16 |
| 2004/0149339 | A1* | 8/2004 | Chang | F04D 13/16 |
| | | | | 137/559 |
| 2008/0101023 | A1* | 5/2008 | Hsu | H01L 23/473 |
| | | | | 361/699 |
| 2017/0339802 | A1* | 11/2017 | Pan | F28D 15/00 |

* cited by examiner

PRESSURIZED INFUSION DEVICE AND LIQUID COOLING SYSTEM

CROSS REFERENCE TO RELATED APPLICATIONS

This patent application is a divisional patent application of U.S. patent application Ser. No. 15/332,458 filed on Oct. 24, 2016 and entitled "PRESSURIZED INFUSION DEVICE AND LIQUID COOLING SYSTEM", which is a non-provisional application claims priority under 35 U.S.C. § 119(a) on Patent Application No(s). 105208509 filed in Taiwan, Republic of China on Jun. 6, 2016, the entire contents of which are hereby incorporated by reference.

TECHNICAL FIELD

The present invention relates to a pressurized infusion device and a liquid cooling system.

BACKGROUND

For the conventional CPU of old generation computers, the air cooling device, which is composed of a heat sink and a fan, is enough to dissipate the generated heat. However, the processing speed of the CPU becomes faster and faster in the recent years and the generated heat are sufficiently increased correspondingly. Besides, the air cooling device is limited by the internal space of the case of the computer and is unable to provide a satisfied heat-dissipation function to the new CPU. In addition, the fan of the air cooling system usually generates a loud and annoying noise while rotating in a high speed. Therefore, the liquid cooling system is good choice to provide a good heat-dissipation performance and a lower noise.

In general, the liquid cooling system has a reservoir tank for storing the heat-dissipation fluid, and a pump is configured to pump the fluid for cooling the heat components of the computer, such as the CPU or graphic card. Some advanced users may buy the components of the liquid cooling system and install the liquid cooling system on their computers by themselves.

SUMMARY

An objective of the present invention is to provide a pressurized infusion device and a liquid cooling system.

The present invention discloses a pressurized infusion device including a liquid storage tank and a pump. The liquid storage tank has a first end and a second end opposite to the first end. The first end has a first connecting structure, and the second end has a second connecting structure. The first connecting structure has the same structure as the second connecting structure. The pump is connected with the first end of the liquid storage tank and has a third connecting structure, a first connecting port, a second connecting port, a third connecting port and a fourth connecting port. The third connecting structure corresponds to the first connecting structure. A pump flow channel from the first connecting port to the second connecting port is formed inside the pump, and a bypass flow channel from the third connecting port to the fourth connecting port is also formed inside the pump.

In one embodiment, the first connecting structure and the third connecting structure are connected by locking, hooking, adhering or wedging.

In one embodiment, the pressurized infusion device further includes a first cap for covering the second end of the liquid storage tank. The first cap has a first through hole and at least a second through hole.

In one embodiment, the first connecting port is communicated with the first through hole via an infusion pipe disposed outside the pump.

In one embodiment, the pressurized infusion device further includes a pipe disposed in the liquid storage tank and connecting to the first through hole of the first cap.

In one embodiment, the second connecting port and the fourth connecting port are located at the same side of the pump, and the third connecting port and the first connecting port are indirectly communicated to each other.

In one embodiment, the first connecting port is communicated with the third connecting port via an infusion pipe disposed outside the pump.

In one embodiment, the pressurized infusion device further includes a pipe disposed in the liquid storage tank and connecting to the second connecting port or the fourth connecting port.

In one embodiment, the pipe is connected to the second connecting port of the pump, and extends from the second connecting port to a place approaching the second end of the liquid storage tank.

In one embodiment, the pressurized infusion device further includes a second cap covering the first end of the liquid storage tank and having a third through hole. The second connecting port of the pump is communicated with the third through hole via an infusion pipe disposed outside the pump.

In one embodiment, the second cap further has a fourth through hole, and the first connecting port of the pump is communicated with the fourth through hole via another infusion pipe disposed outside the pump.

In one embodiment, the pressurized infusion device further includes a pipe disposed in the liquid storage tank and connecting to the fourth through hole of the second cap.

In one embodiment, the first connecting port of the pump is communicated with the first through hole of the first cap via another infusion pipe disposed outside the pump.

In addition, the present invention further discloses a liquid cooling system cooperated with an electronic device. The liquid cooling system includes a pressurized infusion device, a cooling head, a cooling module and a plurality of infusion pipes. The pressurized infusion device includes a liquid storage tank and a pump. The liquid storage tank has a first end and a second end opposite to the first end. The first end has a first connecting structure, the second end has a second connecting structure, and the first connecting structure has the same structure as the second connecting structure. The pump is connected with the first end of the liquid storage tank and has a third connecting structure, a first connecting port, a second connecting port, a third connecting port and a fourth connecting port. The third connecting structure corresponds to the first connecting structure. A pump flow channel from the first connecting port to the second connecting port is formed inside the pump, and a bypass flow channel from the third connecting port to the fourth connecting port is also formed inside the pump. The cooling head is connected with the electronic device. The pressurized infusion device, the cooling head and the cooling module are communicated via the infusion pipes.

As mentioned above, the user can install the proper components of the pressurized infusion device and the liquid cooling system based on the requirements. The assembling of the components is simple, and the installation is easy.

Besides, the air inside the pipes and components can be easily discharged. That is, the invention has the advantage of easy exhausting.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION

The present invention will be apparent from the following detailed description, which proceeds with reference to the accompanying drawings, wherein the same references relate to the same elements.

Figure 1:
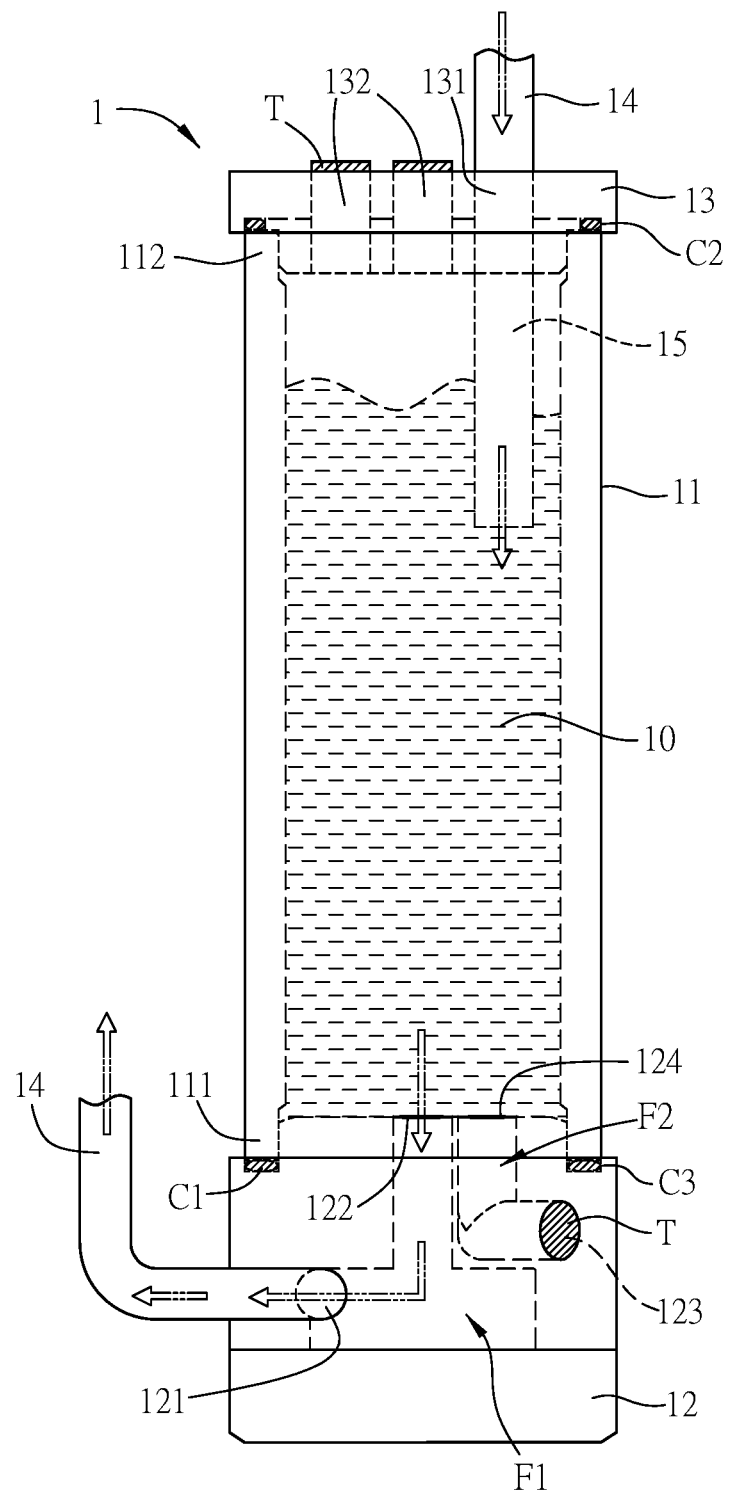
FIGS. 1 to 5 are schematic diagrams showing different aspects of a pressurized infusion device according to a preferred embodiment of the invention.

FIG. 1 is a schematic diagram showing a pressurized infusion device 1 according to a preferred embodiment of the invention.

The pressurized infusion device 1 can be applied to a liquid cooling system (or liquid heat-dissipation system), which can utilize a fluid (e.g. water) to decrease the temperature of a heat source, such as a CPU or graphic card. The pressurized infusion device 1 can be installed between the pipes of the liquid cooling system for providing the storage tank of the fluid and the kinetic of the flowing fluid, so that the fluid can continuously flow in the liquid cooling system to remove the heat generated in the computer.

As shown in FIG. 1, the pressurized infusion device 1 includes a liquid storage tank 11 and a pump 12. In addition, the pressurized infusion device 1 may further include a first cap 13.

The liquid storage tank 11 has a first end 111 and a second end 112 opposite to the first end 111. The first end 111 has a first connecting structure C1, and the second end 112 has a second connecting structure C2. Herein, the first connecting structure C1 has the same structure as the second connecting structure C2. The liquid storage tank 11 is preferably made of transparent material such as, for example but not limited to, acrylic or glass, so that the user can easily observe the level of the fluid 10 inside the liquid storage tank 11. In this embodiment, the liquid storage tank 11 can also be a liquid storage tube or a liquid storage cup.

The pump 12 is connected with the first end 111 of the liquid storage tank 11. In this embodiment, the pump 12 has a third connecting structure C3, a first connecting port 121 and a second connecting port 122. A pump flow channel F1 from the first connecting port 121 to the second connecting port 122 is formed inside the pump 12, and the pump flow channel F1 doesn't communicate with any other pipe. Accordingly, the fluid 10 is restricted to flow within the first connecting port 121, the inside of the pump 12 and the second connecting port 122. In addition, a motor is configured in the pump 12 for driving the impeller (not shown) to rotate so as to provide the kinetic force of the flowing fluid. Thus, the fluid can flow in the pump flow channel F1, which is formed within the first connecting port 121, the inside of the pump 12 and the second connecting port 122.

The third connecting structure C3 of the pump 12 corresponds to the first connecting structure C1 of the liquid storage tank 11. In this embodiment, the first connecting structure C1 and the third connecting structure C3 are corresponding threads, so that the first connecting structure C1 can screw to the third connecting structure C3 so as to directly connecting the pump 12 and the first end 111 of the liquid storage tank 11. Alternatively, it is also possible to connect the second connecting structure C2 with the third connecting structure C3 so as to directly connect the pump 12 with the second end 112 of the liquid storage tank 11. In practice, the pump 12 is configured with a thread (the third connecting structure C3), and the first end 111 and the second end 112 of the liquid storage tank 11 are configured with the corresponding threads (the first connecting structure C1 and the second connecting structure C2). Thus, the first end 111 of the liquid storage tank 11 can connect to the pump 12 by screwing. Since the first connecting structure C1 of the first end 111 of the liquid storage tank 11 has the same structure as the second connecting structure C2 of the second end 112 of the liquid storage tank 11, the pump 12 may also connect to the second connecting structure C2 of the second end 112 by screwing. In some embodiments, the pump 12 and the liquid storage tank 11 may be connected by locking, hooking, adhering or wedging, and this invention is not limited.

The pump 12 may further include a third connecting port 123 and a fourth connecting port 124. The second connecting port 122 and the further connecting port 124 are located at the same side of the pump 12. As shown in FIG. 1, the liquid storage tank 11 is connected with the pump 12, so that the second connecting port 122 and the further connecting port 124 are located inside the liquid storage tank 11. In addition, a bypass flow channel F2 from the third connecting port 123 to the fourth connecting port 124 is also formed inside the pump 12. The third connecting port 123 is indirectly connected to the first connecting port 121. Similarly, the third connecting port 123 and the fourth connecting port 124 are communicated inside the pump 12, so that the fluid 10 can flow between the third connecting port 123, the pump 12 and the fourth connecting port 124. Herein, the bypass flow channel F2 is configured for bypassing the fluid, and it doesn't provide the kinetic force to the fluid.

The first cap 13 covers the second end 112 of the liquid storage tank 11, so that the first cap 13, the liquid storage tank 11 and the pump 12 can form a space for storing the fluid 10. Then, the pump 11 can provide the kinetic force for flowing the fluid 10. In this embodiment, the first cap 13 can cover the second end 112 of the liquid storage tank 11 by screwing, and the connecting structure of the first cap 13 is the same as the third connecting structure C3 of the pump 12. In practice, the user may connect the first cap 13 to the first end C1 of the liquid storage tank 11 and connect the third connecting structure C3 of the pump 12 to the second end C2 of the liquid storage tank 11 depending on the actual requirements. This design can modulate the assembling and disassembling of the components so as to increase the modifications of the entire structure.

The first cap 13 of the second end 112 of the liquid storage tank 11 has a first through hole 131 and two second through holes 132. The first connecting port 121 of the pump 12 is communicated with the first through hole 131 via an infusion pipe 14 disposed outside the pump 12. In addition, the pressurized infusion device 1 further includes a pipe 15 disposed in the liquid storage tank 11 and connecting to the first through hole 131 of the first cap 13.

To be noted, when the pump 12 is operating, and the first through hole 131, the second through holes 132, the first connecting port 121, the second connecting port 122, the third connecting port 123 and/or the fourth connecting port 124 doesn't connect to the pipe or infusion pipe, a plug T can be provided to the through hole or connecting port for preventing the fluid 10 from leakage.

When the liquid cooling system is normally operating, the flow of the fluid 10 of the pressurized infusion device 1 is stated as follow. The pump 12 pumps the fluid 10 stored in the liquid storage tank 11, so the fluid 10 flows to the first connecting port 121 through the pump flow channel F1. Then, the fluid 10 flows in the infusion pipe 14 and passes through the computer for cooling the heating components, and the heat can be dissipated by the cooling module. Afterward, the fluid 10 flows through the first through hole 131 and the pipe 15, and then reaches the liquid storage tank 11. Next, the fluid 10 is pumped into the pump 12 through the second connecting port 122, and then flows out of the pump 12 through the first connecting port 121, thereby forming a flowing loop. As mentioned above, the user can easily install the pressurized infusion device 1 of the embodiment depending on the requirements, and the pump 11 can exhaust the air contained in the pipes and components through the second through holes 132. To be noted, the user can put the plug T in the second through hole 132 after the exhausting of the air in the pipes and components.

FIGS. 2 to 5 are schematic diagrams showing different aspects of pressurized infusion devices 1a~1d according to the preferred embodiment of the invention.

Figure 2:
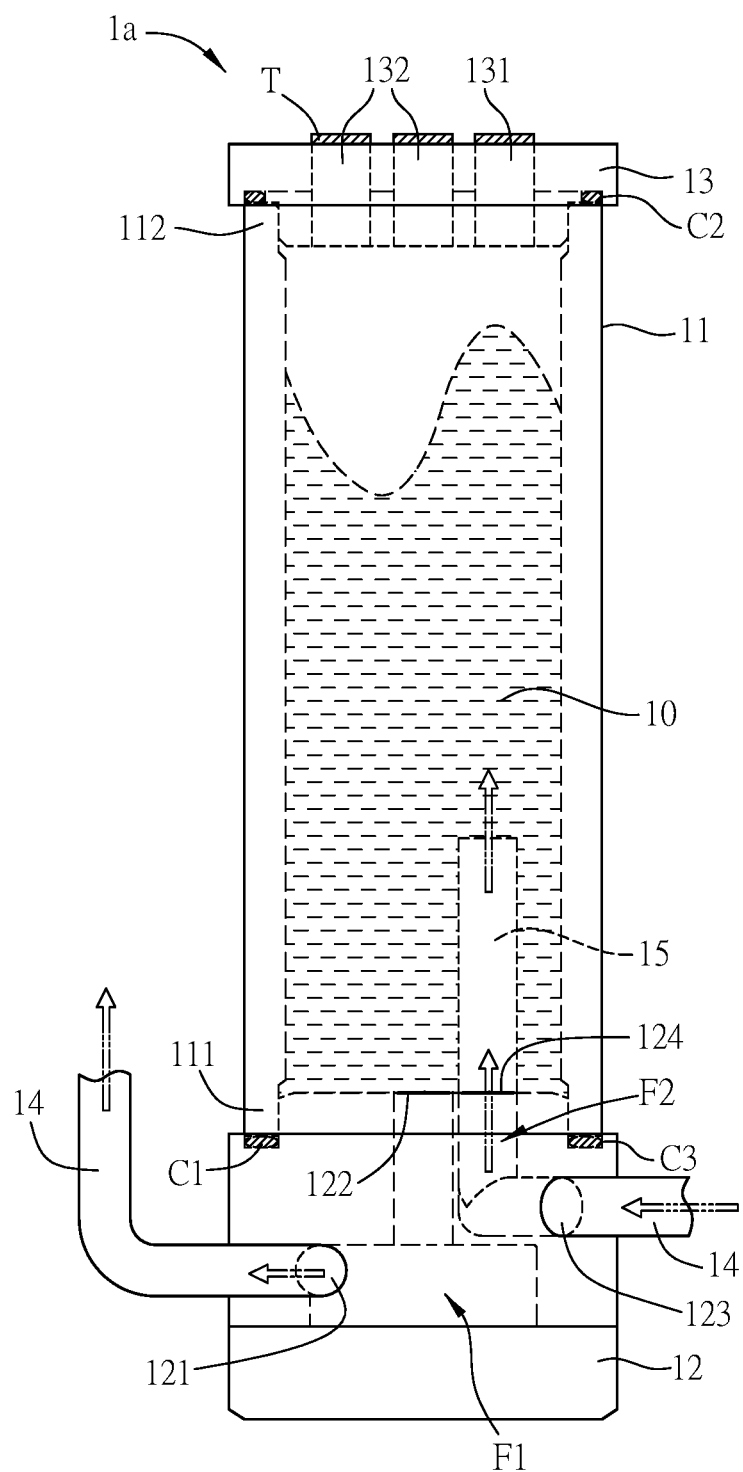

As shown in FIG. 2, the pressurized infusion device 1a includes a liquid storage tank 11, a pump 12, a first cap 13, an infusion pipe 14 and a pipe 15. Different from the pressurized infusion device 1, the first connecting port 121 of the pump 12 of the pressurized infusion device 1a is communicated with the third connecting port 123 of the pump 12 via the infusion pipe 14 disposed outside the pump 12. The pipe 15 located in the liquid storage tank 11 is communicated with the fourth connecting port 124 of the pump 12.

In this aspect, the flow of the fluid 10 in the pressurized infusion device 1a is stated as follow. The fluid 10 flows out through the first connecting port 121 of the pump 12 and then flows in the infusion pipe 14 to pass through the computer for cooling the heating components. The heat can be dissipated by the cooling module. Afterward, the fluid 10 flows to the bypass flow channel F2 from the third connecting port 123, and then enters the liquid storage tank 11 through the fourth connecting port 124 and the pipe 15. Next, the fluid 10 is pumped into the pump 12 through the second connecting port 122, and then flows in the pump flow channel F1 and out of the pump 12 through the first connecting port 121, thereby forming a flowing loop. As mentioned above, the user can easily install the pressurized infusion device 1a of the embodiment depending on the requirements, and the pump 11 can exhaust the air contained in the pipes and components through the first through hole 131 and/or the second through holes 132. To be noted, the user can put the plug T in the first through hole 131 and the second through hole 132 after the exhausting of the air in the pipes and components. Based on the connection of this aspect, the pump 12 can provide enough kinetic force the drive the fluid 10, and the fluid 10 can form a wave or spring in the liquid storage tank 11 so as to provide some joys in operation.

The other technical features of the pressurized infusion device 1a can be referred to the same components of the pressurized infusion device 1, so the detailed descriptions thereof will be omitted.

Figure 3:
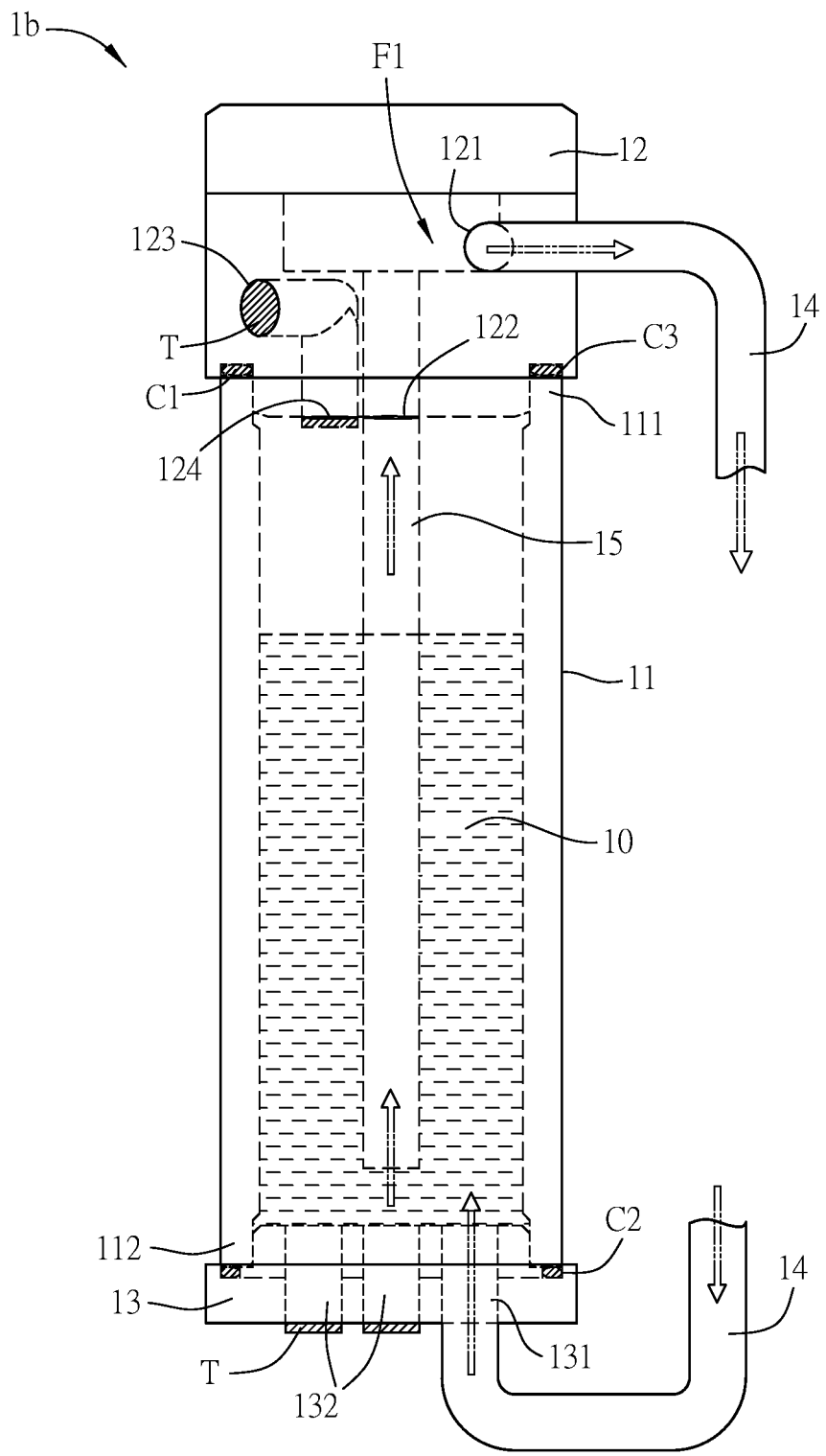

As shown in FIG. 3, the pressurized infusion device 1b includes a liquid storage tank 11, a pump 12, a first cap 13, an infusion pipe 14 and a pipe 15. Different from the pressurized infusion device 1, the pump 12 of the pressurized infusion device 1b is located above the liquid storage tank 11, and the first cap 13 covers the lower end of the liquid storage tank 11. In other words, the pressurized infusion device 1b is a reversed configuration (upside down) of the pressurized infusion device 1. In order to use the pump 12 to pump the fluid 10 stored in the liquid storage tank 11, the pipe 15 of the pressurized infusion device 1b is connected to the second connecting port 122 of the pump 12 and extends to approach the second end 112 of the liquid storage tank 11 (close to the first cap 13).

In this aspect, the flow of the fluid 10 in the pressurized infusion device 1b is stated as follow. The pump 12 pumps the fluid 10 from the bottom of the liquid storage tank 11. Then, the fluid 10 passes through the pipe 15, the second connecting port 122 of the pump 12, and the pump flow channel F1, and flows out through the first connecting port 121. Afterward, the fluid 10 flows in the infusion pipe 14 to pass through the computer for cooling the heating components. The heat can be dissipated by the cooling module. Then, the fluid 10 enters the liquid storage tank 11 through the first through hole 131 of the first cap 13. Next, the fluid 10 is pumped into the pump 12 through the pipe 15 and the second connecting port 122, thereby forming a flowing loop. As mentioned above, the user can easily install the pressurized infusion device 1b of the embodiment depending on the requirements, and the pump 11 can exhaust the air contained in the pipes and components through the third connecting port 123 and the fourth connecting port 124. To be noted, the user can put the plug T in the third connecting port 123 and the fourth connecting port 124 after the exhausting of the air in the pipes and components.

The other technical features of the pressurized infusion device 1b can be referred to the same components of the pressurized infusion device 1, so the detailed descriptions thereof will be omitted.

Figure 4:
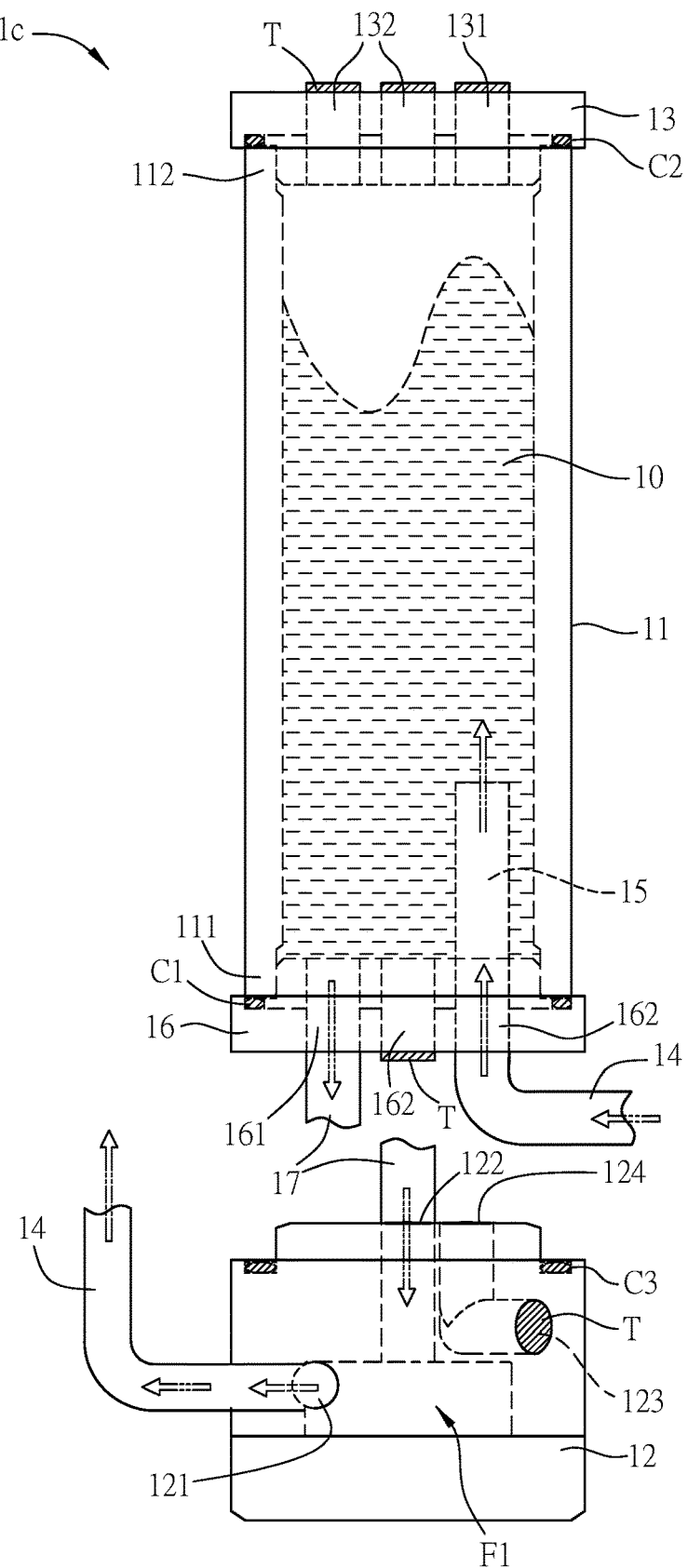

As shown in FIG. 4, the pressurized infusion device 1c includes a liquid storage tank 11, a pump 12, a first cap 13, an infusion pipe 14 and a pipe 15. Different from the pressurized infusion device 1a, the first connecting structure C1 of the first end 111 of the liquid storage tank 11 of the pressurized infusion device 1c is not directly connected to the third connecting structure C3 of the pump 12. In this aspect, the pressurized infusion device 1c further includes a second cap 16, which covers the first end 111 of the liquid storage tank 11 and has a third through hole 161 and two fourth through holes 162. The pump is connected to the second cap 16 of the second end 111 of the liquid storage tank 11 via an infusion pipe 17 disposed outside the pump 12. In more detailed, the second connecting port 122 of the pump 12 is communicated with the third through hole 161 of the second cap 16 via the infusion pipe 17, so that the pump is indirectly connected with the liquid storage tank 11.

In addition, the first connecting port 121 of the pump 12 is communicated with one of the fourth through holes 162 of the second cap 16 via the infusion pipe 14 disposed outside the pump 12. The pipe 15 is connected to the fourth through hole 162 of the cap 16, which is connected to the infusion pipe 14.

In this aspect, the flow of the fluid 10 in the pressurized infusion device 1c is stated as follow. The fluid 10 flows out through the first connecting port 121 of the pump 12 and then flows in the infusion pipe 14 to pass through the computer for cooling the heating components. The heat can be dissipated by the cooling module. Afterward, the fluid 10 enters the liquid storage tank 11 through the fourth through hole 162 and the pipe 15. Next, the fluid 10 is pumped into the pump 12 through the third through hole 161 of the second cap 16, the infusion pipe 17 and the second connecting port 122, and then flows in the pump flow channel F1 and out of the pump 12 through the first connecting port 121, thereby forming a flowing loop. As mentioned above, the user can easily install the pressurized infusion device 1c of the embodiment depending on the requirements, and the pump 11 can exhaust the air contained in the pipes and components through the first through hole 131 and/or the second through holes 132 of the first cap 13. Based on the connection of this aspect, the pump 12 can provide enough kinetic force the drive the fluid 10, and the fluid 10 can form a wave or spring in the liquid storage tank 11 so as to provide some joys in operation.

The other technical features of the pressurized infusion device 1c can be referred to the same components of the pressurized infusion device 1a, so the detailed descriptions thereof will be omitted.

Figure 5:
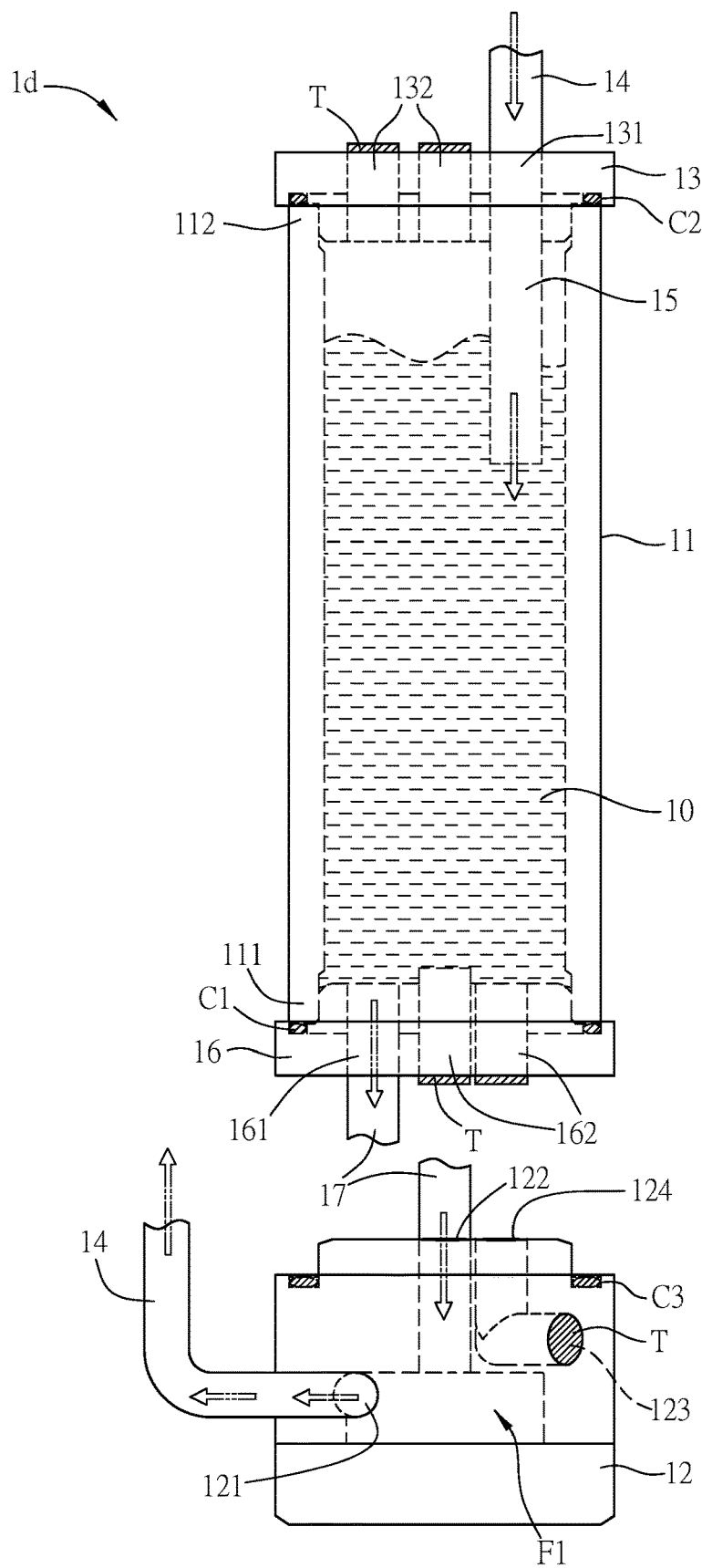

As shown in FIG. 5, the pressurized infusion device 1d includes a liquid storage tank 11, a pump 12, a first cap 13, infusion pipes 14 and 17, a pipe 15, and a second cap 16. Different from the pressurized infusion device 1c, the first connecting port 121 of the pump 12 of the pressurized infusion device 1d is connected to the first through hole 131 of the first cap 13, which covers the second end 112 of the liquid storage tank 11, via the infusion pipe 14 disposed outside the pump 12. The pipe 15 is disposed in the liquid storage tank 11 and connects to the first through hole 131 of the first cap 13.

In this aspect, the flow of the fluid 10 in the pressurized infusion device 1d is stated as follow. The fluid 10 flows out through the first connecting port 121 of the pump 12 and then flows in the infusion pipe 14 to pass through the computer for cooling the heating components. The heat can be dissipated by the cooling module. Afterward, the fluid 10 enters the liquid storage tank 11 through the first through hole 131 of the first cap 13 and the pipe 15. Next, the fluid 10 is pumped into the pump 12 through the third through hole 161 of the second cap 16, the infusion pipe 17 and the second connecting port 122, and then flows in the pump flow channel F1 and out of the pump 12 through the first connecting port 121, thereby forming a flowing loop. As mentioned above, the user can easily install the pressurized infusion device 1d of the embodiment depending on the requirements, and the pump 11 can exhaust the air contained in the pipes and components through the second through hole 132.

The other technical features of the pressurized infusion device 1d can be referred to the same components of the pressurized infusion device 1c, so the detailed descriptions thereof will be omitted.

To be noted, the connections and applications of the above-mentioned pressurized infusion devices 1 and 1a~1d are for illustrations only and are not to limit the scope of the invention, and the users can modify the applications and connections depending on their requirements.

Figure 6:
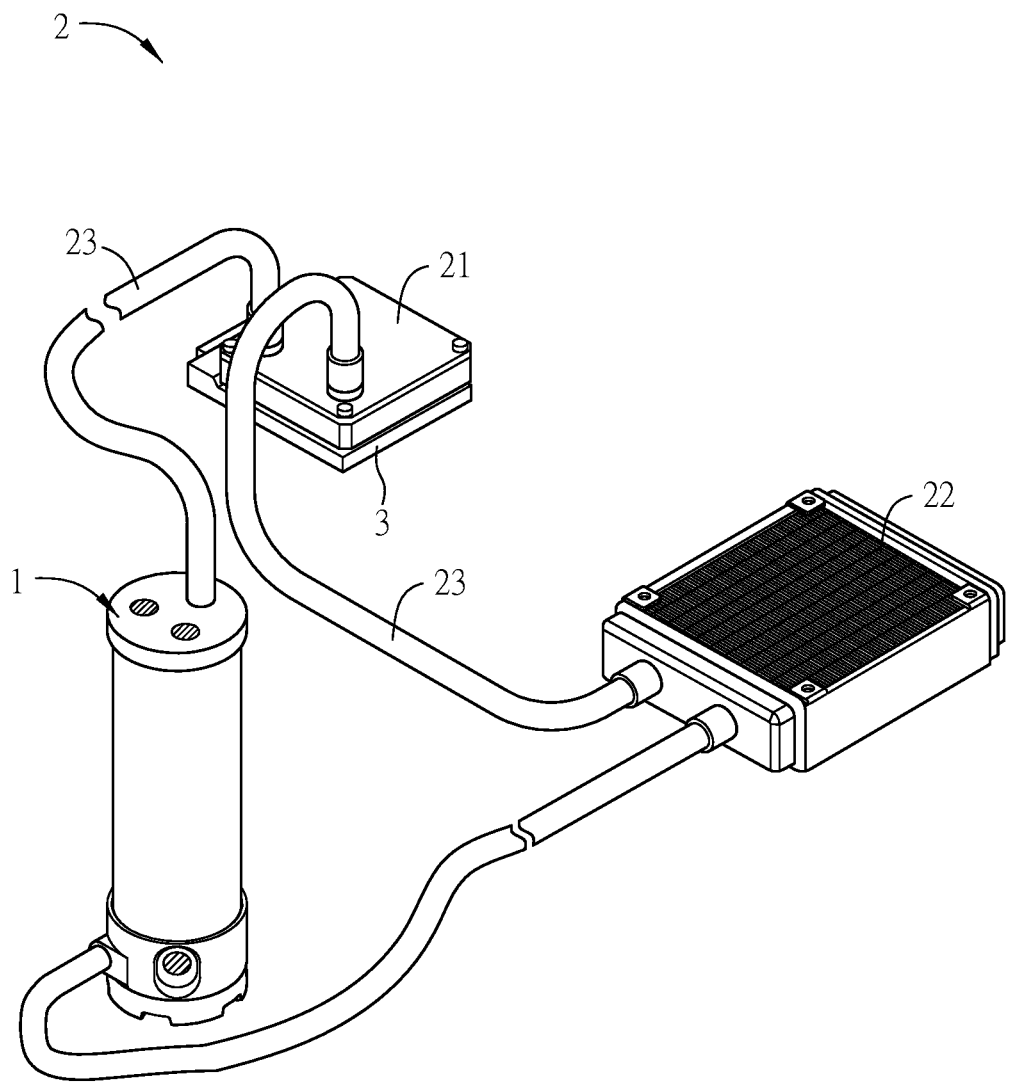
FIG. 6 is a schematic diagram of a liquid cooling system according to the preferred embodiment of the invention.

FIG. 6 is a schematic diagram of a liquid cooling system 2 according to the preferred embodiment of the invention.

The liquid cooling system 2 can decrease the temperature of the heat source, such as the CPU or graphic card of the computer, and includes a pressurized infusion device 1, a cooling head 21, a cooling module 22 and a plurality of infusion pipes 23. The cooling head 21 is connected with an electronic device 3. The pressurized infusion device 1, the cooling head 21 and the cooling module 22 are communicated via the infusion pipes 23 so as to form a loop. Thus, the fluid, which is for example but not limited to water, can cyclically flow within the infusion pipes 23, the pressurized infusion device 1, the cooling head 21 and the cooling module 22 for removing the heat generated by the electronic device 3.

In the liquid cooling system 2, the bottom of the cooling head 21 is attached to the electronic device 3 (e.g. a CPU or graphic card), and the fluid cyclically flows within the pressurized infusion device 1, the cooling head 21 and the cooling module 22 for removing the heat generated by the electronic device 3. Then, the heat can be dissipated by the cooling module 22. As is shown in FIG. 6, in one embodiment, the cooling module 22 is a radiator.

The pressurized infusion device 1 of this embodiment can be replaced by any of the above-mentioned pressurized infusion devices 1 and 1a~1d, and their modifications. The detailed technical contents, connections and applications have been described in the above embodiment, so they are not repeated here.

In summary, the user can install the proper components of the pressurized infusion device and the liquid cooling system based on the requirements. The assembling of the components is simple, and the installation is easy. Besides, the air inside the pipes and components can be easily discharged. That is, the invention has the advantage of easy exhausting.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A pressurized infusion device, comprising:
   a liquid storage tank having a first end and a second end opposite to the first end;
   a pump connected with the first end of the liquid storage tank and having a first connecting port, a second connecting port, a third connecting port and a fourth connecting port, wherein a pump flow channel from the first connecting port to the second connecting port is formed inside the pump, and a bypass flow channel from the third connecting port to the fourth connecting port is also formed inside the pump;
   a first cap, covering the second end of the liquid storage tank and having a first through hole and at least one second through hole, wherein the first connecting port is communicated with the first through hole via an infusion pipe disposed outside the pump;
   wherein the first end is located at the top of the liquid storage tank and the second end is located at the bottom of the liquid storage tank; and
   a pipe disposed in the liquid storage tank connected to the second connecting port and extending from the second connecting port to a bottom portion of the liquid storage tank which is adjacent the first cap.

2. The pressurized infusion device of claim 1, wherein the second connecting port and the fourth connecting port are located at the same side of the pump, and the third connecting port and the first connecting port are indirectly communicated to each other.

* * * * *